US009095886B2

(12) United States Patent
Simaan et al.

(10) Patent No.: US 9,095,886 B2
(45) Date of Patent: Aug. 4, 2015

(54) MILL CONTROL SYSTEM AND METHOD FOR CONTROL OF METAL STRIP ROLLING

(75) Inventors: Marwan A. Simaan, Winter Park, FL (US); John Pittner, Pittsburgh, PA (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 1073 days.

(21) Appl. No.: 13/169,469

(22) Filed: Jun. 27, 2011

(65) Prior Publication Data

US 2012/0324971 A1  Dec. 27, 2012

(51) Int. Cl.
*B21B 37/50* (2006.01)
*G06F 17/50* (2006.01)

(52) U.S. Cl.
CPC ............. *B21B 37/50* (2013.01); *G06F 17/5018* (2013.01)

(58) Field of Classification Search
CPC ........................ B21B 2265/02; B21B 2265/06
USPC ...................... 72/7.1, 7.4, 8.6, 8.7, 11.4, 12.3; 700/150, 152; 703/2, 6, 7
See application file for complete search history.

(56) References Cited

U.S. PATENT DOCUMENTS

| | | |
|---|---|---|
| 3,531,961 A | 10/1970 | Dunn |
| 3,574,280 A | 4/1971 | Smith, Jr. |
| 3,722,244 A | 3/1973 | Fujii et al. |
| 3,808,857 A | 5/1974 | Connors |
| 4,063,438 A | 12/1977 | Sekiguchi et al. |
| 4,141,071 A | 2/1979 | Yerkes et al. |
| 4,286,447 A | 9/1981 | Peterson |
| 5,040,395 A | 8/1991 | Seki et al. |
| 5,479,803 A * | 1/1996 | Imanari ............................ 72/8.6 |
| 5,701,774 A * | 12/1997 | Imanari et al. .................... 72/8.6 |
| 5,787,746 A * | 8/1998 | Ferreira ......................... 72/11.3 |
| 6,263,714 B1 | 7/2001 | Johnson et al. |
| 2001/0034560 A1* | 10/2001 | Krogmann ....................... 700/31 |
| 2007/0068210 A1* | 3/2007 | Pittner et al. .................... 72/10.1 |
| 2010/0032165 A1* | 2/2010 | Bailey et al. .................. 166/369 |

OTHER PUBLICATIONS

Remn-Min Guo, Principal Research Engineer, "Analysis of Dynamic Behaviors of Tandem Cold Mills Using Generalized Dynamic and Control Equations", Armco Research & Technology, IEEE Transactions on Industry Applications, vol. 36, No. 3, 842-853, May/Jun. 2000.

(Continued)

*Primary Examiner* — Shelley Self
*Assistant Examiner* — Lawrence Averick
(74) *Attorney, Agent, or Firm* — Timothy H. Van Dyke; Beusse, Wolter, Sanks & Maire P.A.

(57) ABSTRACT

Mill control system and method for metal strip rolling controlled in response to a sequence of controller scans are provided. A sensor suite is coupled to sense a plurality of parameters regarding the strip rolling. A model responsive to the sensed parameters is configured to estimate per scan at least one matrix based on the sensed parameters and indicative of state conditions of the strip rolling. A controller includes an inner control loop configured to effect a control law to generate a control vector per scan. The inner control loop may be configured to have dynamic characteristics, which remain substantially the same for each scan of the controller. The dynamic characteristics of the inner control loop are effective to determine a pointwise online control solution based on the matrix indicative of the state conditions of the strip rolling, without having to compute a Riccati control solution per scan.

17 Claims, 5 Drawing Sheets

(56) References Cited

OTHER PUBLICATIONS

Asada, H., et al. "Adaptive and Robust Control Method with Estimation of Rolling Characteristics for Looper Angle Control at Hot Strip Mill", ISIJ International, vol. 43, No. 3, 358-365, 2003.

Asano, K. et al., "Hot strip mill tension-looper control based on decentralization and coordination", Control Engineering Practice, 8: 337-344, 2000.

Hesketh, T. et al., "Control Design for Hot Strip Finishing Mills", IEEE Transactions on Control Systems Technology, 6(2): 208-219, Mar. 1998.

Imanari, H. et al., "Looper H-Infinity Control for Hot Strip Mill", IEEE Transactions on Industry Applications, 33(3): 790-796, 1997.

Janabi-Sharifi, F., "A neuro-fuzzy system for looper tension control in rolling mills", Control Engineering Practice, 13, 1-13, 2005.

Yildiz, S.K., Huang, B., Fraser Forbes, J., "Dynamics and variance control of hot mill loopers", Control Engineering Practice, 16, 89-100, 2008.

Kenney, C.S. and Laub, A.J., "The Matrix Sign Function", IEEE Transactions on Automatic Control, (40)8: 1330-1348, 1995.

I-S Choi, J.A. Rossiter, and P.J. Fleming, "Robust constrained predictive controllers for hot rolling mills: disturbance uncertainty case", Proc. IMechE vol. 222 Part I: J. Systems and Control Engineering, JSCE401 IMechE, 137-152, 2008.

I.S. Choi, J.A. Rossiter, and PJ Fleming, "Looper and tension control in hot rolling mills: A survey", Journal of Process Control 17 (2007), 509-521.

Gerald Hearns Michael J. Grimble, "Robust Multivariable Control for Hot Strip Mills", ISIJ International, vol. 40, No. 10, pp. 995-1002, 2000.

G. Hearns and M.J. Grimble, "Inferential control for rolling mills", IEE Proc-Control Theory Appl., vol. 147, No. 6, 673-679, 2000.

H. Imanari, Y. Seki, K. Sekiguchi, and Y. Anbe, "Application of ILQ control theory to steel rolling processes", Supplied by the British Library—"The world's knowledge", Steel Rolling '98, Chiba, Japan, The Iron and Steel Institute of Japan, pp. 36-41, 1998.

M. Okada et al., "Optimal control system for hot strip finishing mill", Pergamon, Control Engineering Practice 6, 1029-1034, 1998.

Y. Seki et al., "Optimal Multivariable Looper Control for Hot Strip Finishing Mill", IEEE Transactions on Industry Applications, vol. 27, No. 1, 124-130, 1991.

\* cited by examiner

MILL CONTROL SYSTEM AND METHOD FOR CONTROL OF METAL STRIP ROLLING

STATEMENT REGARDING FEDERALLY SPONSORED DEVELOPMENT

Development for this invention was supported in part by grant No. 0951843, awarded by the United States National Science Foundation. Accordingly, the United States Government may have certain rights in this invention.

FIELD OF THE INVENTION

The invention generally relates to control systems, and, more particularly, to a system for controlling rolling of a metal strip in a rolling mill, such as hot metal strip rolling.

BACKGROUND OF THE INVENTION

A significant process in metalworking is the tandem rolling of a metal strip. The rolling process may be classified according to the temperature of the metal being rolled. If the temperature of the metal is above its recrystallization temperature, the process is generally referred to as hot rolling. If the temperature of the metal is below its recrystallization temperature, the process is generally referred to as cold rolling.

The rolling of a hot metal strip presents substantial control challenges due to the complex interaction of a large number of variables, and may involve many non-linear, time-varying variables. This challenge is heightened by the hostile nature of a hot rolling environment, which, for example, may preclude reliably measuring certain variables that may be needed for control purposes.

Known control strategies tend to result in sub-optimal control since often such strategies shy away from systematically addressing the complex dynamic interactions among the large number of variables of the entire rolling mill and their resulting effect on important process variables, such as strip tension, looper position, strip thickness. A few attempts have been made at considering the entire mill as a single entity, e.g., using advanced control techniques based on linearized models, but often these control techniques introduce unacceptable complexities in a real-world setting, such as lack of user-friendliness in connection with the operation and/or tuning of the concomitant controller. Accordingly, there is a need for an improved system to control rolling of a hot metal strip in a rolling mill.

BRIEF DESCRIPTION OF THE DRAWINGS

The invention is explained in the following description in view of the drawings that show.

DETAILED DESCRIPTION OF THE INVENTION

Figure 1:
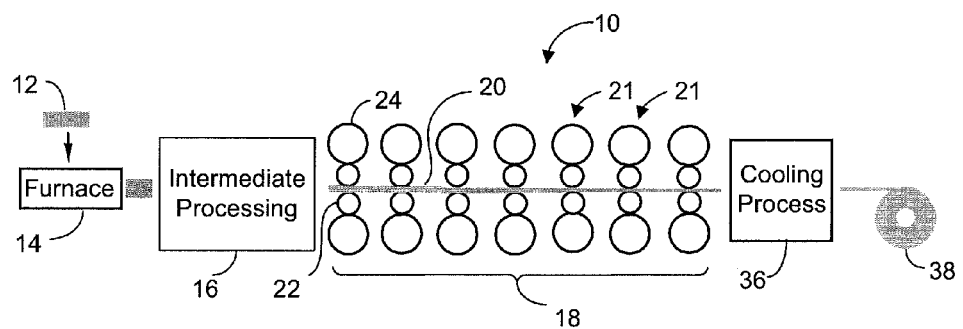
FIG. 1 is a schematic representation of an example hot metal tandem rolling mill, which may benefit from aspects of the present invention.
Figure 2:
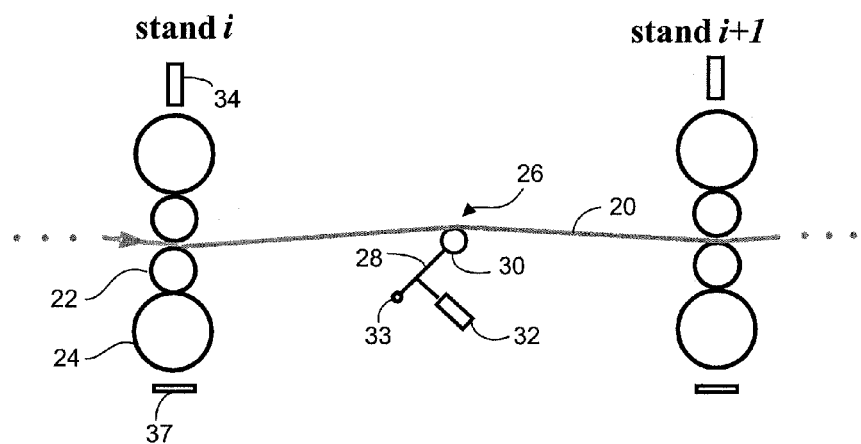
FIG. 2 is a schematic representation of an example looper component, as may be part of the hot metal rolling mill.

FIG. 1 is a schematic representation that shows an example hot metal rolling mill 10, as may benefit from aspects of the present invention. Metal slabs 12, which may have been produced in a previous rolling or casting operation, may be placed in a reheating furnace 14 and heated to temperatures suitable for intermediate processing 16 and subsequent entry into a tandem hot strip finishing mill 18 (e.g., the physical plant to be controlled). In mill 18, a working piece 20 (e.g., strip) is passed through a number of stands 21 each including independently driven work rolls 22 (e.g., five to seven pairs), with each work roll supported by a back-up roll 24 of larger diameter. As shown in FIG. 2, one or more load-sensing cells 37 may be used to monitor the load at the stands. As further shown in FIG. 2, between each pair of work rolls there is a looper 26, which is a mechanism including an arm 28 and a roll 30, as may be driven by a suitable actuator 32 (e.g., hydraulics device or electric motor). For example, arm 28 may be controllably pivoted about a pivot point 33 to keep the strip 20 at a reference tension.

As the strip 20 passes through the individual pairs of work rolls 22 in the finishing mill, the thickness of strip 20 is successively reduced to a desired thickness value (e.g., ranging from approximately 1.5 mm to approximately 12 mm). The reduction in thickness is caused by a substantially high compressive stress applied to a small region (e.g., roll bite, or roll gap) between opposing work rolls 22. The necessary compression force may be applied by a suitable compression device 34 (e.g., hydraulic rams, or a screw arrangement as may be driven by an electric motor). After strip 20 exits the last stand, the strip 20 may be cooled in an exit cooling process 36 at controlled rates by the application of water sprays to achieve desired metallurgical properties. Strip 20 is then passed to a coiler 38 for suitable coiling.

A control system embodying aspects of the present invention in one example embodiment may comprise four main control-related entities, which interact with one another in synergistic fashion to effect an innovative control technique to control the tandem hot metal strip rolling mill. These four entities are 1) a nonlinear mathematical model of the hot metal strip rolling, 2) a controller adapted to implement a pointwise, linear quadratic optimization technique, 3) one or more trimming control loops, which enhance the performance of the controller, and 4) an overall control strategy, which is implemented by way of interactions among the foregoing three entities to realize the control system embodying aspects of the present invention. The following provides a description of example aspects of each of these control entities.

Aspects Regarding Mathematical Model of Hot Strip Rolling

As will be appreciated by one skilled in the art, a mathematical model of the physical plant (e.g., the tandem hot strip rolling mill) is a set of mathematical expressions, which when executed by a processor or any suitable computing device allow relating a plurality of physical parameters (e.g., rolling parameters) to one another. It is noted that aspects of the present invention are not limited to the specific model described below since alternative models could be utilized, provided such models may be implemented on a computerized platform (e.g., PC) without an excessive computational burden. Example output parameters of the mathematical model of the tandem hot strip rolling mill may be as follows:

Specific Roll Force

An estimation of specific roll force is basic to the development of the overall control model. In one example embodiment, the specific roll force may be represented as $$P = (kQ_p - \bar{\sigma})\sqrt{R_p \delta} \quad (1)$$

where P is the specific roll force, k is the constrained yield stress of the material, $Q_p$ is a factor which compensates for friction and any inhomogeneity of deformation, $\bar{\sigma}$ is the mean tension stress of the strip (e.g., $$\bar{\sigma} = \frac{\sigma_{in} + \sigma_{out}}{2},$$

where $\sigma_{in}$ and $\sigma_{out}$ are the strip tension stresses at the stand input and output), $R_p$ is the deformed work roll radius which is estimated using the well-known Hitchcock approximation, and $\delta$ is the stand draft (e.g., $\delta = h_{in} - h_{out}$, where $h_{in}$ and $h_{out}$ are the respective input and output thickness of the strip). See FIG. 3, which is a zoom-in diagram illustrating example details between corresponding surfaces of strip piece 20 and work roll 22 (only one work roll shown for simplicity of illustration).

Strip Exit Thickness

The exit thickness $h_{out}$ may be estimated using the linearized relation for the output thickness as $$h_{out} = S + S_0 + \frac{F}{M}, \quad (2)$$

where S is the position of the roll bite position actuator, $S_0$ is the intercept of the linearized approximation, F is the total rolling force (equal to PW, where W is the strip width), and M is the mill modulus which represents the elastic stretch of the mill stand under the application of the rolling force F.

Forward Slip

Figure 3:
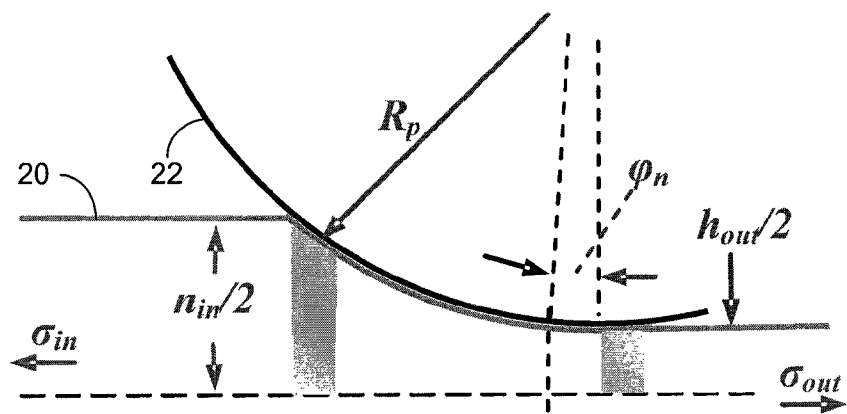
FIG. 3 is a zoom-in diagram illustrating example details between corresponding surfaces of a work piece (e.g., metal strip) and a work roll.

The forward slip f is a measure of the strip speed exiting the roll bite and is defined as the ratio of the relative velocity of the exiting strip to the peripheral speed of the roll, $$f = \frac{V_{out} - V_0}{V_0}, \quad (3)$$

where $V_{out}$ is the exit strip speed and $V_0$ is the peripheral speed of the roll, which is approximately equal to the strip speed at the angle $\phi_n$ from the centerline of the mill stand (FIG. 3). An example model representation for forward slip and useful in the development of control may be expressed as $$f = \left(\frac{R_p}{h_{out}}\right)(\beta_n)^2, \quad (4)$$

where $$\beta_n = \frac{\phi_1}{2} - \frac{\delta k + \sigma_{in} h_{in} - \sigma_{out} h_{out}}{4 k R_p \mu}, \quad (5)$$

with $$\phi_1 = \left(\frac{\delta}{R_p}\right)^{1/2}, \quad (6)$$

and where $\mu$ is the friction coefficient, and other symbols are as defined previously. In the case of hot rolling $\mu$ is taken as the coefficient for sticking friction, which is approximated by the following empirical relationship $\mu = 0.00027 T_F - 0.08$, where $T_F$ is the temperature of the work piece in degrees F.

Work Roll Position and Speed Controllers

The position of the actuator (e.g., hydraulic cylinder) that sets the work roll position at the roll bite may be estimated to be a single first order lag as $$\frac{dS}{dt} = \frac{U_S}{\tau_S} - \frac{S}{\tau_S}, \quad S(0) = S_0, \quad (7)$$

where S is the cylinder position, $U_S$ is the position reference, and $\tau_S$ is the time constant of the first order lag. The peripheral speed of the work rolls may also be estimated to be a single first order lag as $$\frac{dV}{dt} = \frac{U_V}{\tau_V} - \frac{V}{\tau_V}, \quad V(0) = V_0, \quad (8)$$

where V is the roll peripheral speed, $U_V$ is the speed reference, and $\tau_V$ is the time constant of the first order lag.

Interstand Time Delays

The interstand time delay is the time taken for an element of the strip to move between adjacent stands and may be approximated as $$\tau_{d,i,i+1} = \frac{L}{V_{out,i}} \quad (9)$$

where L is the length of strip between stands i and i+1 considering the looper movement, and $V_{out,i}$ is the strip speed at the output of stand i.

Looper

Figure 8:
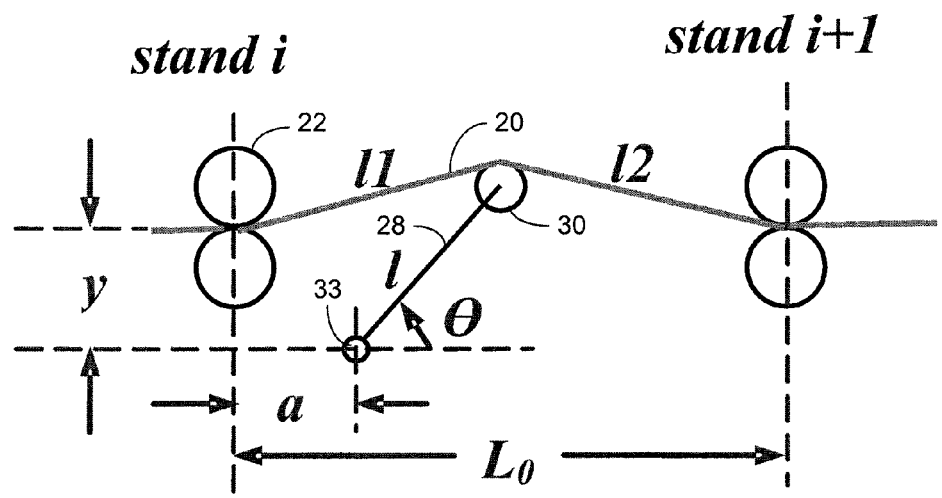
FIG. 8 is diagram illustrating some example details in connection with an example looper.

The arm position angle of a looper may be determined as $$\frac{d\theta}{dt} = \omega, \quad \theta(0) = \theta_0, \quad (10)$$

where $\omega$ is the looper angular velocity which is derived from Newton's second law of motion, and is described as $$\frac{d\omega}{dt} = \frac{1}{J_{looper}}[M_{looper} + M_{friction} + M_{load}], \quad \omega(0) = 0, \quad (11)$$

where $J_{looper}$ is the looper moment of inertia, $M_{looper}$ is the torque applied to the looper mechanism (e.g., using a controlled hydraulic cylinder), $M_{friction}$ is the friction torque of the looper mechanism, $M_{load}$ is the load torque which is $$M_{load} = M_{strip\ tension} + M_{strip\ weight} + M_{looper\ mass} + M_{strip\ bending} \quad (12)$$

where $M_{strip\ tension}$, $M_{strip\ weight}$, $M_{looper\ mass}$, and $M_{strip\ bending}$ are the torques resulting from the strip tension force, the strip weight, the mass of the looper mechanism, and the bending of the strip at the looper roll. The torque $M_{looper}$ is approximated as a single first order lag, which for example, includes the looper hydraulic cylinder with its controller, $$\frac{dM_{looper}}{dt} = \frac{U_{M_{looper}}}{\tau_M} - \frac{M_{looper}}{\tau_M}, \quad M_{looper}(0) = M_{looper,0}, \quad (13)$$

where $U_{M_{looper}}$ is the torque controller reference, and $\tau_M$ is the time constant of the first order lag. The friction torque of the looper mechanism is described as $$M_{friction} = k_{viscous}\omega, \quad (14)$$

where $k_{viscous}$ is a viscous friction constant. See FIG. 8 illustrating some example details in connection with an example looper. Typical looper dimensions may be $\theta=15$ degrees, $L_0=5.48$ m, $l_1=2.68$ m, $l_2=2.81$ m, $l=0.76$ m, $y=0.19$ m, $a=1.94$ m. It is noted that aspects of the present invention are not limited to any specific looper dimensions.

Work Piece Temperatures

Estimation of the steady-state temperatures of the work piece at each stand may be externally-derived by a separate higher level system, as would be appreciated by one skilled in the art, and made available to the controller embodying aspects of the present invention. Temperature changes at each stand due to temperature disturbances at the mill entry may be estimated in the model by tracking such disturbances at the mill entry, with suitable adjustments for drops in temperatures as the disturbances progress through the mill.

State and Output Equations

The equations of the model representing the nonlinear variables involved in a hot rolling mill embodying aspects of the present invention may be expressed in the form of a state equation (15) and an output equation (16), $$\frac{dx}{dt} \equiv \dot{x} = A(x)x + Bu, \quad x(0) = x_0, \quad (15)$$

$$y = C(x)x, \quad (16)$$

where $x \in R^n$ (e.g., $n=38$) is a vector whose elements represent the individual state variables, $A(x) \in R^{n \times n}$ is a state-dependent matrix indicative of the process (e.g., hot rolling), $y \in R^p$ (e.g., $p=26$) is a vector whose elements represent the individual output variables, $C(x) \in R^{p \times n}$ is a state-dependent output matrix, $u \in R^m$ (e.g., $m=20$) is a vector whose elements represent the individual control variables, and $B \in R^{n \times m}$ is a constant control matrix. Example variables respectively represented by the elements of the state, control, and output vectors may be as shown in Table I, where U represents a control reference, $U_{M,i,i+1}$ is the torque reference for the looper between stands i and i+1 and also may be a shortened notation for $U_{M_{looper}}$ as in equation (13), with other symbols, as previously noted.

TABLE I

STATE VECTOR, CONTROL VECTOR, AND OUTPUT VECTOR VARIABLE ASSIGNMENTS

| State Vector | | Control Vector | Output Vector | |
|---|---|---|---|---|
| $x_1$ ($\sigma_{12}$) | $x_{21}$ ($M_{12}$) | $u_1$ ($U_{S1}$) | $y_1$ ($h_{out1}$) | $y_{14}$ ($P_1$) |
| $x_2$ ($\sigma_{23}$) | $x_{22}$ ($M_{23}$) | $u_2$ ($U_{S2}$) | $y_2$ ($h_{out2}$) | $y_{15}$ ($P_2$) |
| $x_3$ ($\sigma_{34}$) | $x_{23}$ ($M_{34}$) | $u_3$ ($U_{S3}$) | $y_3$ ($h_{out3}$) | $y_{16}$ ($P_3$) |
| $x_4$ ($\sigma_{45}$) | $x_{24}$ ($M_{45}$) | $u_4$ ($U_{S4}$) | $y_4$ ($h_{out4}$) | $y_{17}$ ($P_4$) |
| $x_5$ ($\sigma_{56}$) | $x_{25}$ ($M_{56}$) | $u_5$ ($U_{S5}$) | $y_5$ ($h_{out5}$) | $y_{18}$ ($P_5$) |
| $x_6$ ($\sigma_{67}$) | $x_{26}$ ($M_{67}$) | $u_6$ ($U_{S6}$) | $y_6$ ($h_{out6}$) | $y_{19}$ ($P_6$) |
| $x_7$ ($S_1$) | $x_{27}$ ($\theta_{12}$) | $u_7$ ($U_{S7}$) | $y_7$ ($h_{out7}$) | $y_{20}$ ($P_7$) |
| $x_8$ ($S_2$) | $x_{28}$ ($\theta_{23}$) | $u_8$ ($U_{V1}$) | $y_8$ ($\sigma_{12}$) | $y_{21}$ ($\theta_{12}$) |
| $x_9$ ($S_3$) | $x_{29}$ ($\theta_{34}$) | $u_9$ ($U_{V2}$) | $y_9$ ($\sigma_{23}$) | $y_{22}$ ($\theta_{23}$) |
| $x_{10}$ ($S_4$) | $x_{30}$ ($\theta_{45}$) | $u_{10}$ ($U_{V3}$) | $y_{10}$ ($\sigma_{34}$) | $y_{23}$ ($\theta_{34}$) |
| $x_{11}$ ($S_5$) | $x_{31}$ ($\theta_{56}$) | $u_{11}$ ($U_{V4}$) | $y_{11}$ ($\sigma_{45}$) | $y_{24}$ ($\theta_{45}$) |
| $x_{12}$ ($S_6$) | $x_{32}$ ($\theta_{67}$) | $u_{12}$ ($U_{V5}$) | $y_{12}$ ($\sigma_{56}$) | $y_{25}$ ($\theta_{56}$) |
| $x_{13}$ ($S_7$) | $x_{33}$ ($\omega_{12}$) | $u_{13}$ ($U_{V6}$) | $y_{13}$ ($\sigma_{67}$) | $y_{26}$ ($\theta_{67}$) |
| $x_{14}$ ($V_1$) | $x_{34}$ ($\omega_{23}$) | $u_{14}$ ($U_{V7}$) | | |
| $x_{15}$ ($V_2$) | $x_{35}$ ($\omega_{34}$) | $u_{15}$ ($U_{M12}$) | | |
| $x_{16}$ ($V_3$) | $x_{36}$ ($\omega_{45}$) | $u_{16}$ ($U_{M23}$) | | |
| $x_{17}$ ($V_4$) | $x_{37}$ ($\omega_{56}$) | $u_{17}$ ($U_{M34}$) | | |
| $x_{18}$ ($V_5$) | $x_{38}$ ($\omega_{67}$) | $u_{18}$ ($U_{M45}$) | | |
| $x_{19}$ ($V_6$) | | $u_{19}$ ($U_{M56}$) | | |
| $x_{20}$ ($V_7$) | | $u_{20}$ ($U_{M67}$) | | |

Aspects Regarding Elements of the A(x), B, and C(x) Matrices

The elements of the A(x) matrix may be chosen to represent physical characteristics of the plant. The A(x) matrix is not unique and its elements therefore may be chosen in accordance with the objectives of the controller for the hot rolling mill. In one example embodiment, a control objective may be improvement in performance while maintaining simplicity in the controller structure. Accordingly, the general form of a non-constant element $A_{i,j}$ of matrix A(x) may be $A_{i,j}/x_j$, where j is an index chosen to provide appropriate numerical values for over a range of values expected during operation of the controller, while providing appropriate performance.

In one example embodiment, non-zero elements of constant control matrix B may be as follows: Elements $B_{7,1}$, $B_{8,2}$ ... $B_{13,7}$, may each be equal to $1/\tau_S$; elements $B_{14,8}$, $B_{15,9}$, ... $B_{20,14}$, may each be equal to $1/\tau_V$, and elements $B_{21,15}$, $B_{22,16}$ ... $B_{26,20}$, may each be equal to $1/\tau_M$, remaining elements of the B matrix may be equal to zero. In one example embodiment, the nonzero elements of C(x) may be of the general form $$c_{i,j} = \frac{p_i}{x_j},$$

where $p_i$ is a variable assigned to $y_i$ in Table I, and $x_j$ is chosen to give an appropriate value for $c_{i,j}$.

Example Uncertainties and Disturbances

It will be appreciated that one desirable aspect in the functioning of a controller is the mitigation of the effects of uncertainties and/or disturbances, such as may arise due to modeling and/or measurement uncertainties. Some example uncertainties in the modeling of the tandem hot strip rolling mill may be mill entry thickness (e.g., +/−5%), workpiece temperatures (e.g., +/−30° C.), equivalent carbon content of the workpiece (e.g., +/−30%), mill modulus (e.g., +/−10%). Example uncertainties in plant measurements obtained from the tandem hot strip rolling mill may be strip tension stress (e.g., +/−1%), roll gap actuator position, work roll peripheral speed, roll force, looper torque, angle, and angular velocity, which measurement uncertainties may be on the order of +/−0.1%.

The magnitude of the uncertainty in the mill modulus may be reduced to less than 2% by standard techniques, as would be known to one skilled in the art. It is also presumed that roll eccentricity effects may be appropriately compensated so that these effects may be considered to be negligible.

Figure 4:
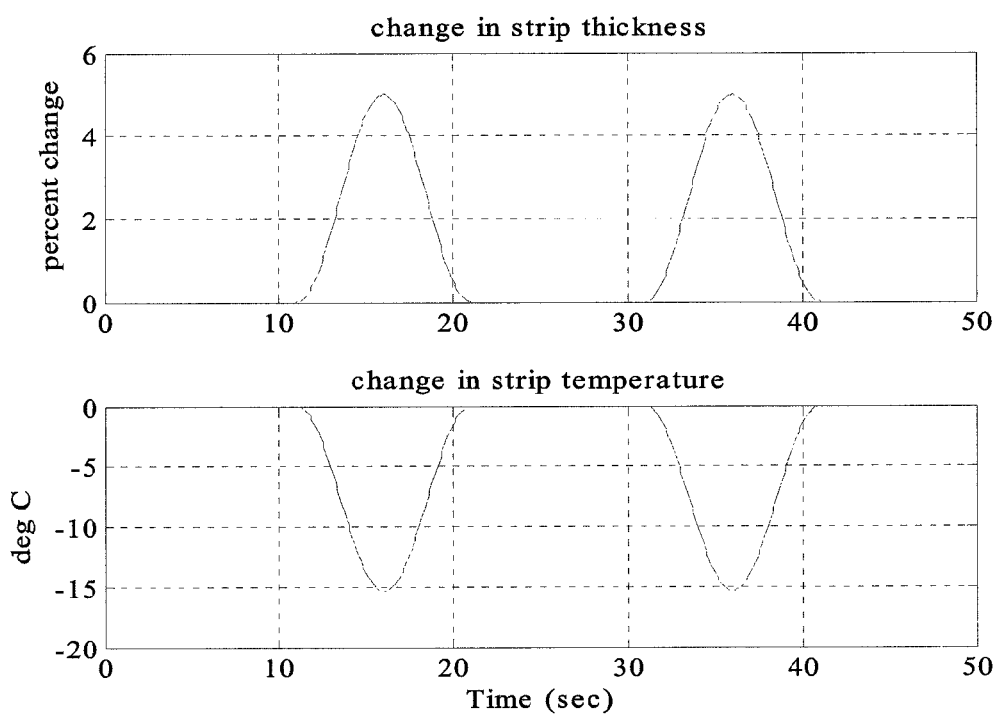
FIG. 4 shows respective plots of example control disturbances, such as variations in incoming strip thickness and strip temperature.

Example notable disturbances may be variations in incoming strip thickness and temperature, e.g., due to skid chill in the reheating furnace, as illustrated in FIG. 4. The temperature disturbances in the incoming material may be tracked from stand to stand as the strip moves through the mill, and may be combined with the temperature uncertainties and with the example temperatures listed in Table II.

Aspects Regarding an Example Operating Point

A typical operating point of the tandem hot strip rolling mill may be at a threaded condition and at operating speed, with a strip tension of approximately 0.01 kN/mm² between each pair of adjacent stands, and with each looper at an angle of approximately 15 degrees. Table II lists an example operating point strip thickness ($h_{out}$), example average strip temperature (T) at the mill entry and at the exit of each stand, example peripheral speed of the work rolls ($V_0$) and example undeformed work roll radius (R) of each stand. It will be appreciated that aspects of the present invention are not limited to any specific operating point values and the operating point values listed below should be construed in an example sense and not in a limiting sense.

TABLE II

TYPICAL MILL OPERATING POINT

| Stand | $h_{out}$ (mm) | T (° C.) | $V_0$ (m/sec) | R (mm) |
|---|---|---|---|---|
| entry | 38.8 | 1058 | — | — |
| 1 | 21.6 | 988 | 1.188 | 360 |
| 2 | 14.4 | 973 | 1.823 | 336 |
| 3 | 8.6 | 957 | 2.957 | 353 |
| 4 | 6.1 | 938 | 4.294 | 343 |
| 5 | 4.7 | 922 | 5.665 | 388 |
| 6 | 3.9 | 904 | 6.946 | 348 |
| 7 | 3.5 | 894 | 7.880 | 369 |

Controller Aspects

A controller may be configured to perform a linear quadratic optimization technique that may be solved on a pointwise basis. The following provides a description of certain example controller aspects.

Linear Quadratic Controller Aspects

As will be appreciated by those skilled in the art, the term linear quadratic controller refers to a control technique wherein a performance index J may be minimized to realize an optimal controller. The controller is optimal in the sense that when applied to a process, the controller may reduce undesired deviations in certain state variables from their desired values. The term "quadratic" is used as x'Qx and u'Ru are quadratic in x and u respectively. The term "linear" is used as the controller is based on a linearization of the process model. The symbol ' indicates the transpose of a vector or matrix. Mathematically, the foregoing concepts may be expressed as $$\dot{x} = Ax + Bu, \quad x(0) = x_0, \tag{17}$$

$$\min_u \left( J = \frac{1}{2} \int_0^\infty (x'Qx + u'Ru) \, dt \right), \tag{18}$$

where x and u are respectively the state and control vectors, A and B are the coefficient matrixes of the linearized process model, and Q and R are constant, state-weighing matrixes whose elements may be selected by the control designer to determine how the function to minimize J may be respectively distributed (weighed) between the state and control functions. The determination of a control law to implement such a controller may be achieved in one example embodiment by solving an algebraic Riccati equation (ARE)

$$A'K + KA - KBR^{-1}B'K + Q = 0, \tag{19}$$

where $K \in R^{n \times n}$ is the solution to equation (19) and $R^{-1}$ denotes the inverse of the matrix R. The resulting control law may be expressed as $$u = -R^{-1}B'Kx. \tag{20}$$

Pointwise Controller Aspects

In the typical control of a tandem hot mill, the algorithm for control of the mill is written in computer-readable code, which may be executed on a digitally-based processor. The execution of the various portions of the code may be performed in a sequential fashion in accordance with a predetermined sequence that is programmed by the control designer. The sequential execution of the entire control code is denoted as a scan of the control code during which the various portions of the code are executed, so that the complete control code is executed in the predetermined sequence during one scan. The scan is then continuously repeated to control the mill during the processing of the present strip.

As an example, during a scan, the code may be executed to perform functions in the following sequence to determine the control vector u: 1) acquiring data from plant measured variables, 2) computing the vector x based on the acquired data, 3) determining a control vector u, (e.g., solve equation 20), 4) iteratively performing the previous steps until the processing of the present strip is finished. Thus, when a function, such as a solution to a particular equation, is said to be implemented pointwise, it will be understood that such a function is performed during every scan of the mill controller, unless otherwise indicated.

Pointwise Linear Quadratic Control Aspects

It will be appreciated that pointwise linear quadratic control is generally referred to in the art as a state-dependent algebraic Riccati (SDRE) technique. In this technique, the coefficient matrices of the state equation and state-weighing matrixes Q and R, become functions of the state vector x, so that the above equations may be rewritten as $$\dot{x} = A(x)x + B(x)u, \quad x(0) = x_0, \tag{21}$$

$$\min_u \left( J = \frac{1}{2} \int_0^\infty (x'Q(x)x + u'R(x)u) \, dt \right), \tag{22}$$

$$A'(x)K(x) + K(x)A(x) - K(x)B(x)R(x)^{-1}B(x)'K(x) + Q(x) = 0, \tag{23}$$

$$u = -R(x)^{-1}B(x)'K(x)x. \tag{24}$$

Thus, traditionally, during every scan of the controller, the state vector may be determined, the state-dependent matrices A(x), B(x), Q(x), and R(x) may be computed, and the state-dependent algebraic Riccati equation (ARE) (23) may be solved to compute matrix K(x), which may then be used in the control law defined by equation 24 to determine the control vector u. It will be appreciated that this is an iterative process so that in general the ARE equation is solved at every scan and the control vector u is updated at every scan.

In one example embodiment for control of the hot mill, the matrixes B, Q, and R may be taken as constant matrices, which may be determined off-line prior to rolling, where the B matrix is set by the model, and the Q and R matrices may be intuitively set to achieve a desired performance of the controller. It is noted, however, that in equations 21, 23 and 24, the A(x) and K(x) matrices remain functions of the state vector x. The foregoing aspect has been innovatively recognized by the inventors of the present invention as conducive to a simpler control strategy while providing appropriate performance.

Trimming Control Loop (Trims) Aspects

Aspects of the present invention provide trimming functions, or trims, which are single-input-single-output (SISO) functions, as may be configured to implement one or more outer control loops. The controller configuration for the hot mill may be arranged so that these SISO functions form an outer control loop constructed around an inner multi-input-multi-output (MIMO) control loop.

Figure 5:
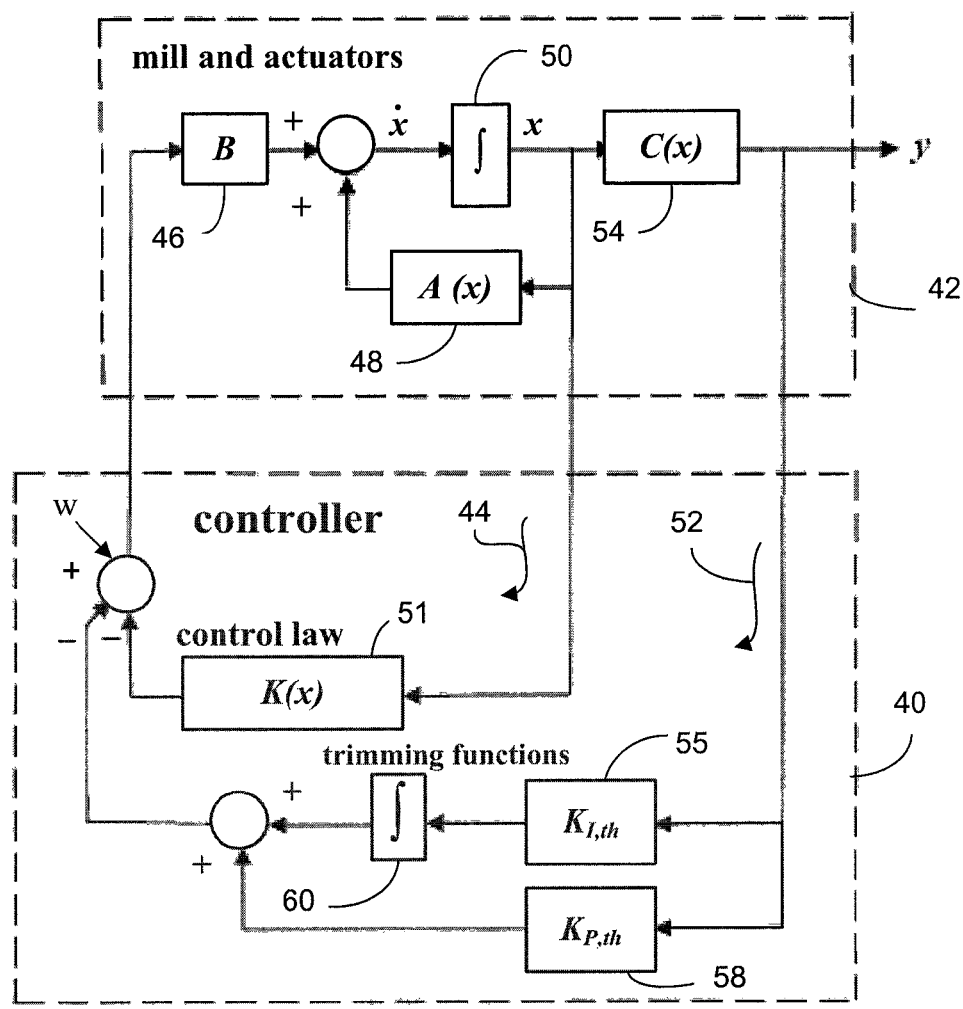
FIG. 5 is a block diagram representation intended to facilitate explanation of control trims (e.g., thickness and/or tension trims) embodying aspects of the present invention.

FIG. 5 is a block diagram illustrating a simplified controller configuration 40 coupled to a hot rolling mill 42 (e.g., the plant). This simplified configuration is intended to facilitate explanation of trims embodying aspects of the present invention. In FIG. 5, an inner control loop 44 includes matrix B represented by block 46, matrix A(x) represented by block 48, an integration function 50, and a control law K(x) (e.g., MIMO) represented by block 51.

In one example embodiment, an outer control loop 52 includes inner loop 44 (e.g., closed via control law block 51), matrix C(x) represented by block 54, and one or more trimming functions, which in this simplified representation may be made up of an integration gain block 55 (block labeled $K_{I,th}$) and an associated integration block 60 (e.g., mathematical integration) and a proportional gain block 58 (block labeled $K_{P,th}$).

In one example embodiment, integration gain block 55 and proportional gain block 58 may comprise constant diagonal matrices whose elements each represent a respective tunable constant gain for a SISO trim, with inputs from appropriate elements of the vector y. Integration gain block 55 represents the gains for a plurality of integral trims, and proportional gain block 58 represents the gains for a plurality of proportional trims.

It will be appreciated that the functionality of the respective trims provided by outer loop 52 is conducive to improving the performance of inner control loop 44. More specifically, the trims may reduce the error in the control of the associated variables represented by elements of the output vector y, may improve the mitigation of disturbances and uncertainties, and may provide a relatively uncomplicated means for controller adjustments during commissioning.

Overall Control Technique Aspects

In one example embodiment, a controller embodying aspects of the present invention may involve at least two modes of operation: a pre-roll mode and a roll mode. In the pre-roll mode, preparation is made for the controller to process the next strip in the hot mill. In an off-line preparation, as may be performed prior to the pre-roll mode, the controller and the process may be simulated to establish appropriate settings for the elements of the constant diagonal Q matrix and the initial settings of the tunable trim gains, R may be taken as the identity matrix. Appropriate simulations may be performed using the foregoing example model of the hot metal rolling mill at a typical operating point.

In the off-line preparation the elements of the $A(x_0)$ and $C(x_0)$ matrices for a given operating point $x_0$ may be computed based on the values of the states at operating point $x_0$.

The elements of the matrix B may be constants, as noted previously. A control law may be determined off-line using the foregoing SDRE technique, and one or more simulations may be performed to verify steady-state and dynamic performance considering example uncertainties and disturbances (e.g., uncertainties and disturbances typical for the process). The settings of the elements of the Q matrix and the trim values may be determined intuitively and may be confirmed by one or more simulations. The values of the elements of a matrix denoted as $K_0$ may be determined, where $K_0$ is the overall gain of the control law at the operating point $x_0$, e.g.

$$K_0 = R^{-1}B'K(x_0).$$

For strips being considered in the pre-roll mode, it is unnecessary to solve the state-dependent ARE for each upcoming strip to be rolled, or to perform further off-line preparation for each strip to be rolled. This is because when in the pre-roll mode the incoming strip may require just a change in the control law gain $K_0$ to correspond with a change in matrix $A(x_0)$, such as may occur from the initial off-line preparation to the pre-roll mode. For example, matrix $A(x_0)$, as determined by the model for the upcoming strip in the pre-roll mode, will likely be somewhat different from the matrix $A(x_0)$ determined in the off-line preparation. However, any such change may be readily accounted for with an updated control law gain $K_0$.

It is noted that the update to determine $K_0$ in the pre-roll mode may be similar to the update to determine $K_i$ in the roll mode. For example, $K_0$ in the pre-roll mode may be determined as $$K_{0,PR} = B^{-L}(A_{PR}(x_0) - A_{prep}(x_0)) + K_{0,prep},$$

where $K_{0,PR}$ is the gain $K_0$ in the pre-roll mode, $K_{0,prep}$ is the gain $K_0$ in the off-line preparation, and $A_{PR}(x_0)$ and $A_{prep}(x_0)$ are the matrices $A(x_0)$ in the pre-roll mode and the off-line preparation respectively, with the constant matrix B as previously noted. This is similar to what is noted in (25) for updates in the roll mode.

It will be also appreciated that the foregoing aspect simplifies the determination of the initial trim settings for the upcoming strip. For example, if the inner loop dynamic characteristics are chosen to be invariant, keeping the overall outer loop dynamic characteristics very nearly invariant would involve just straightforward trim adjustments, such as to provide compensation, if needed, to account for any changes that may occur in the $C(x_0)$ matrix between the off-line preparation and the pre-roll mode. That is any changes in the $C(x_0)$ matrix may be used to determine any adjustments in the trim gain matrices $K_{I,th}$ and $K_{P,th}$ in blocks 55 and 58 of the controller 40 as depicted in FIG. 5 to keep the overall outer loop dynamic characteristics essentially invariant. The differences between $C(x_0)$ in the pre-roll mode and $C(x_0)$ in the roll mode are relatively small so that they can be considered essentially negligible. During actual operation in the roll mode the deviations between those elements of the C(x) and $C(x_0)$ matrices that apply to the trimming functions also are small so that the overall outer loop dynamic characteristics remain very nearly invariant during actual operation. Thus, the desirable performance obtained in the off-line preparation would be carried over to the pre-roll mode and subsequently to the roll mode. Further detail on keeping the inner loop invariant in the roll mode is described in the description that follows.

In the roll mode a strip is being processed through the mill. In this mode, the control law is determined such that the dynamic characteristics of the inner control loop remain substantially the same from scan to scan of the controller during the processing of the strip. This is done by computing the overall gain of the control law on a pointwise basis, e.g., starting with $K_0$, as determined in the pre-roll mode, as the strip is processed through the mill. One key aspect of the present invention is keeping the matrix difference $(A_i(x)-BK_i)$ substantially constant as the elements of the state vector x change from scan to scan, where i represents the present scan. Since the elements of the vector x are measurable, the elements of the matrix $A_i(x)$ for scan i can be determined based on the measured values of the elements of x for scan i. $K_i$ is then computed as $$K_i = B^{-L}(A_i(x) - A_{i-1}(x)) + K_{i-1}, \quad (25)$$

where $A_{i-1}(x)$ and $K_{i-1}$ are as computed on scan i−1, i.e. the previous scan, and $B^{-L}$ is a left inverse of the constant matrix B, with B configured, as noted for example in section 1, to assure that a left inverse exists. An example inverse may be the Moore-Penrose pseudo left inverse, which may be computed off-line as $$B^{-L} = (B'B)^{-1}B'. \quad (26)$$

The ordinary differential equation (ODE) for closed inner-loop 44 (FIG. 5) may be represented by $$\dot{x} = (A_i(x) - BK_i)x + Bw, \; x(0) = x_0. \quad (27)$$

As should be appreciated from equation (27), keeping the matrix difference $(A_i(x)-BK_i)$ substantially constant from scan to scan (as noted above) keeps the closed loop dynamic characteristics of the inner loop essentially unchanged from scan to scan.

As would be appreciated by those skilled in the art, use of the word "substantially" in expressions, such as "dynamic characteristics, which remain substantially the same for each scan of the controller" and/or "a matrix difference $(A_i(x)-BK_i)$ substantially constant from scan to scan", is meant to recognize the presence (in a real-world, practical control system embodying aspects of the present invention) of non-zero uncertainties in modeling and/or measurement typical of those noted herein, which may result in non-zero uncertainties in certain elements of the A(x) matrix with a resulting change in the dynamic characteristics of the inner control loop. However, as has been shown by simulation, the changes to certain elements of the A(x) matrix resulting from such uncertainties, and the corresponding changes to the dynamic characteristics, are on the order of a few percent at most, so that changes to the A(x) matrix and the corresponding changes to the dynamic characteristics remain essentially negligible in the presence of these uncertainties.

In accordance with aspects of the present invention, the algebraic Riccati equation (ARE) need only be solved off-line and, consequently, a controller embodying aspects of the present invention does not need to solve ARE on-line for each strip and at every scan since just the control gain $K_i$ requires a pointwise recalculation to account for the changes in the A(x) matrix. This advantageously reduces the scan time and avoids the difficult design problem of having to determine a new Q matrix at each scan to obtain a desired $K_i$.

Figure 6:
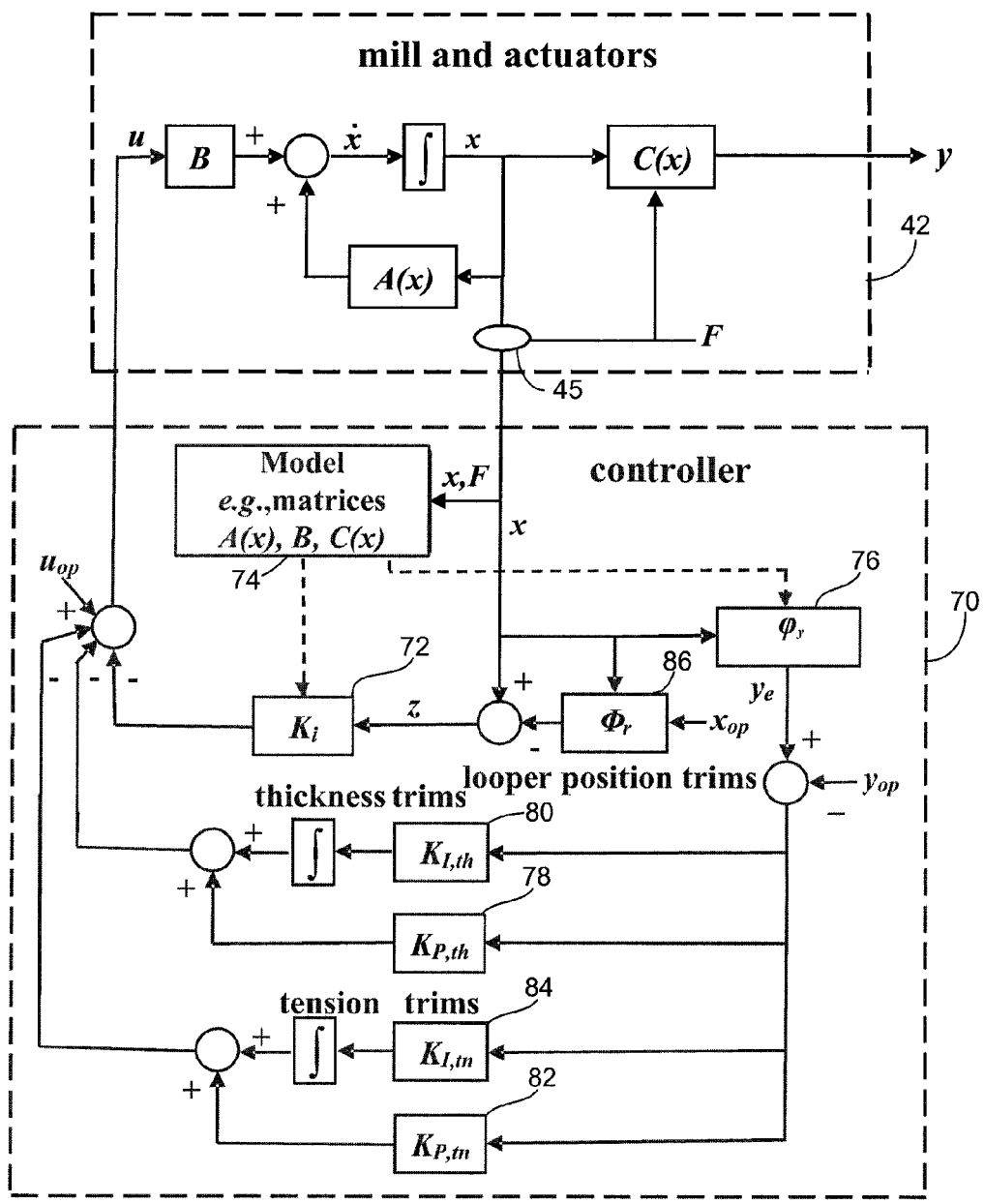
FIG. 6 is a block diagram representation of an example overall control system structure embodying aspects of the present invention.

FIG. 6 is a block diagram representation of an example overall controller 70 embodying aspects of the present invention. The vectors x and u at a given operating point may be represented by variables $x_{op}$ and $u_{op}$. Vector $y_{op}$ is a vector whose elements may be indicative of operating point values for respective thicknesses and tensions. Block 72 represents feedback control gain $K_i$, which may be calculated in accordance with equation (25) using matrices A(x) and B, as may be obtained from the mathematical model of the plant, represented by block 74. Matrix B is a constant matrix and the A(x) and C(x) matrices would be updated for each scan by model 74 in response to plant measurements, as may be obtained with a sensor suite 45, from which the individual state variables and the measurements of the rolling force (F) at each stand may be obtained.

A coordinate change may be performed by the introduction of a vector $z = x - x_{op}$, which shifts the operating point to the origin. The elements of the state vector x are each measurable, $y_e$ is a vector whose elements may be used in the thickness and tension trims. Block 76 (labeled coy) represents a processing module configured to generate vector $y_e$.

In one example embodiment, outputs $y_{e1}$ to $y_{e7}$ (see Table 1) of processing module $\phi_y$ may constitute the thickness output variables $h_{out1}$ to $h_{out7}$ (elements $y_1$ to $y_7$ of the output vector, as may be computed in accordance with equation 2, using the appropriate elements of the matrix C(x)), and outputs $y_{e8}$ to $y_{e13}$ may constitute the strip tensions (elements $x_1$ to $x_6$ of the state vector). The matrices labeled in the respective thickness and tension trim blocks may be diagonal matrices whose elements are the proportional-integral (PI) tunable gains for the trims on thickness and tension, which use appropriate elements of the vector $(y_e - y_{op})$ as inputs (FIG. 6), where vector $y_{op}$ is as noted above, and $(y_e - y_{op})$ represents deviations from the desired operation point values. For example, blocks 84 and 82 (respectively labeled $K_{P,tn}$ and $K_{I,tn}$) are the proportional and integral tunable gain matrixes for the tension trims respectively, and blocks 78 and 80 (respectively labeled $K_{P,th}$ and $K_{I,th}$) are the proportional and integral tunable gain matrixes for the thickness trims, respectively.

Figure 7:
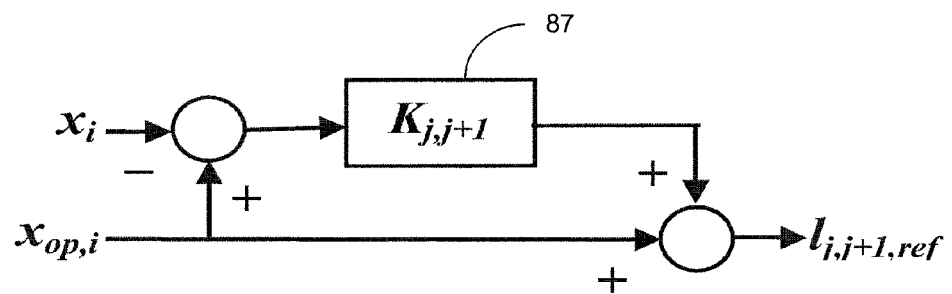
FIG. 7 is a block diagram representation intended to facilitate explanation of further control trims (e.g., looper operating point trims) embodying aspects of the present invention.

Block 86 (labeled $\phi_r$) represents a processing module configured to generate respective looper position operating point trims. FIG. 7 is a block diagram showing processing elements as may be arranged to generate respective looper position operating point trims. For example, $x_{op,i}$ (i=27, ..., 32) is an element of the vector $x_{op}$ that represents the operating point for the position of the looper between stands j,j+1 (j=1, ..., 6), $l_{j,j+1,ref}$ is the looper position reference for stands j,j+1, $x_i$ is the element of the state vector which represents the measured looper position for stands j,j+1, and block 87 (labeled $K_{j,j+1}$) is a gain for stands j,j+1. A direct feed-through may be provided for the remaining elements of $x_{op}$.

The controller structure used in the off-line preparation (e.g., prior to the pre-roll mode) may be similar to the arrangement shown in FIG. 6, except that block 72 (labeled $K_i$) would be replaced with a block denoted as $R^{-1}B' K(x_0)$ (i.e., involving a SDRE controller configured to solve a Riccati equation).

From the foregoing it will be appreciated that, in accordance with aspects of the present invention, the algebraic Riccati equation (ARE) need only be solved off-line and, consequently, a controller embodying aspects of the present invention advantageously avoids having to solve ARE on-line for each strip and at every scan. This aspect of the invention advantageously reduces the scan time, and avoids having to determine a new Q matrix at each scan to determine the control gain $K_i$. It will be appreciated that although the foregoing description was provided in the example context of a hot metal rolling application, a cold metal rolling application may similarly benefit from aspects of the present invention, such as avoiding computation of an on-line ARE solution at every scan. For readers desirous of general background information in connection with a cold metal rolling process, reference is made to US patent application publication No. 2007/0068210 A1, which is incorporated by reference herein in its entirety.

The performance index (22) may be modified to be $$J = \frac{1}{2}\int_0^\infty (z'Qz + (u-u_{op})'R(u-u_{op}))dt, \qquad (28)$$

where for simplicity Q and R are taken as constant diagonal matrixes as described previously.

In operation, aspects of the present invention are believed to offer at least the following example advantages:

1) A controller embodying aspects of the present invention is configured to account for a multiplicity of interactions occurring among the numerous variables throughout the mill since the whole mill is treated as a single entity. This leads to reductions in the excursions from the operating point in inter-stand tensions, looper positions, and strip thicknesses at the exits of the mill stands. This represents a substantial improvement over known control techniques where a looper and its adjacent stands are considered separately, with interacting variables treated as disturbances. As would be appreciated by those skilled in the art of tandem hot metal rolling, the reduction in excursions in tensions and looper positions reduces deviations from the desired geometry of the exit product which in turn improves the quality of the mill output. Moreover, a reduction in the excursions in tensions and thicknesses improves the overall rolling stability.

2) A controller embodying aspects of the present invention is configured so that effects of changes in the A(x) matrix will have essentially no effect on the dynamics of the inner control loop, and thus changes in the A(x) matrix due to disturbances and uncertainties in turn will have essentially no effect on the system performance. This represents a substantial improvement over known control techniques where disturbances and uncertainties, (e.g., significant changes in the equivalent carbon content and temperature of the strip being rolled), can have a relatively greater effect on system performance.

3) A controller embodying aspects of the present invention is configured so that the time involved for performing a scan is substantially reduced over known control techniques that involve solving an algebraic Riccati equation (ARE). Also, in accordance with aspects of the present invention, the ARE may be initially solved off-line, which reduces the controller complexity with corresponding reductions in design and commission times, as considerably less tuning during commissioning is needed to achieve desirable performance over a wide range of products. Control design efforts are also reduced as less design effort needs to be expended to determine suitable controller settings for a wide product range. This ultimately translates into significant cost savings as both the design and commissioning times are reduced with a resulting earlier entry into the productive and profitable operation of the mill.

4) In accordance with aspects of the present invention, a linearized model is not needed, which further reduces the complexity of the controller as coefficients for the linearized model do not need to be computed which further reduces the design effort.

5) In accordance with aspects of the present invention, since the dynamic response of the inner control loop is configured to be essentially invariant between the pre-roll mode and the roll mode, the amount of on-line tuning is reduced. This reduces commissioning time, which also supports faster startups with earlier entry into productive operations.

6) In accordance with aspects of the present invention, the use of SISO trims contributes to the ease of tuning as there is a one-to-one relationship between a tuning parameter and the variable being tuned. This is an improvement over known control techniques, such as H-infinity loop-shaping, wherein controller adjustments involve MIMO and may require familiarity with advanced control techniques. Commissioning personnel are generally unfamiliar with advanced control methods, which would make the tuning of MIMO controllers relatively more cumbersome and often unrealistic for the commissioning of tandem hot mills.

7) In accordance with aspects of the present invention, the closed-loop control action of the trims contributes toward reducing the effects of uncertainties and/or certain unmodeled perturbations since these uncertainties and/or perturbations often occur inside the control loops of the trims, and thus trims embodying aspects of the present invention contribute to the robustness of the controller in the event of any such uncertainties and/or perturbations.

8) In accordance with aspects of the present invention, the trim functions are effective in reducing the effects of inter-stand time delays. This occurs by the trims providing immediate outer loop control action for the estimated strip thicknesses at the stand outputs without having to deal with the significant effects of the time delays in the control of these variables, as would be the case if only the inner control loop were used. However, during outer loop control action, the inner MIMO control loop remains effective so that corresponding changes in variables over the entire process are made inherently.

It should be understood that aspects of the inventive system and method disclosed herein may be implemented in any appropriate operating system environment using any appropriate programming language or programming technique. The system can take the form of a hardware embodiment, a software embodiment or an embodiment containing both hardware and software elements. In one example embodiment, the system may be implemented by software (e.g., controls) and hardware (e.g., sensors), which includes but is not limited to firmware, resident software, microcode, etc. Furthermore, parts of the system can take the form of a computer program product accessible from a computer-usable or computer-readable medium providing program code for use by or in connection with a computer or any instruction execution system. Examples of a computer-readable medium may include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. The display may be a tablet, flat panel display, PDA, or the like.

A processing system suitable for storing and/or executing program code will include in one example at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution. Input/output or I/O devices (including but not limited to keyboards, displays, pointing devices, etc.) can be coupled to the system either directly or through intervening I/O controllers. Network adapters may also be coupled to the system to, enable the data processing system to become coupled to other data processing systems or remote printers or storage devices through intervening private or public networks. Modems, cable modem and Ethernet cards are just a few of the currently available types of network adapters.

While various embodiments of the present invention have been shown and described herein, it will be apparent that such embodiments are provided by way of example only. Numerous variations, changes and substitutions may be made without departing from the invention herein. Accordingly, it is intended that the invention be limited only by the spirit and scope of the appended claims.

The invention claimed is:

1. A mill control system for metal strip rolling controlled in response to a sequence of controller scans, the system comprising:
a sensor suite coupled to sense a plurality of parameters regarding the strip rolling;
a model responsive to the sensed parameters and configured to estimate per scan at least one matrix based on the sensed parameters and indicative of state conditions of the strip rolling; and
a controller comprising an inner control loop to effect a control law to generate a control vector per the scan, the inner control loop configured to have dynamic characteristics, which remain substantially the same for each scan of the controller, wherein the dynamic characteristics of the inner control loop are effective to determine a pointwise on-line control solution based on the at least one matrix indicative of the state conditions of the strip rolling, without having to compute a Riccati control solution per the scan wherein said dynamic characteristics of the inner control loop are established by keeping a matrix difference ($A_i(x)-BK_i$) substantially constant from scan to scan, wherein $A_i(x)$ represents the matrix estimated by the model indicative of the state conditions of the strip rolling for a present scan, B represents a constant control matrix, and $K_i$ represents a control gain matrix for the present scan.

2. The mill control system of claim 1, wherein the control gain matrix for a present scan is defined by $K_1=B^{-L}(A_i(x)-A_{i-1}(x))+K_{i-1}$, where $B^{-L}$ represents a left inverse of the constant control matrix B, $A_{i-1}(x)$ represents the matrix estimated by the model indicative of the state conditions of the strip rolling for a previous scan, $K_{i-1}$ represents the control gain matrix for the previous scan.

3. The mill control system of claim 1, wherein the mill comprises a hot rolling mill comprising a plurality of spaced-apart stands each including at least mutually opposing work rolls arranged to apply in response to control signals derived from the control vector respective compression forces to controllably shape a thickness of a metal strip traveling between the mutually opposing rollers, the rolling mill further including a plurality of loopers respectively interposed between adjacent stands and arranged to controllably provide in response to further control signals derived from the control vector respective levels of inter-stand tension to the traveling strip.

4. The mill control system of claim 3, wherein the inner control loop comprises a multiple-input, multiple output control loop, and wherein the controller further comprises at least a first outer control loop and a second outer control loop with respect to the inner control loop, the first and second outer control loops each respectively comprising a plurality of single-input, single output control loops, the first and second outer control loops each including at least one respective tunable gain matrix, the first outer control loop configured to generate a first group of control trims and the second outer control loop configured to generate a second group of control trims, wherein the first group of control trims comprises a plurality of thickness trims and the second group of control trims comprises a plurality of tension trims.

5. The mill control system of claim 4, wherein the controller further comprises a control loop coupled to the inner control loop configured to generate a plurality of looper position trims.

6. The mill control system of claim 1, wherein the model comprises a non-linear model.

7. A rolling mill configured to perform a hot metal strip rolling controlled in response to a sequence of control scans, the mill comprising: a sensor suite coupled to sense a plurality of parameters regarding the hot strip rolling; a non-linear model responsive to the sensed parameters and configured to estimate per scan at least one matrix based on the sensed parameters indicative of state conditions of the hot strip rolling; a controller coupled to the model and comprising an inner control loop to effect a control law to generate a control vector per scan; and a plurality of spaced-apart stands each including at least mutually opposing work rolls arranged to apply in response to control signals derived from the control vector respective compression forces to controllably shape a thickness of a metal strip traveling between the opposing rollers, the rolling mill further including a plurality of loopers respectively interposed between adjacent stands and arranged to controllably provide in response to further control signals derived from the control vector respective levels of inter-stand tension to the traveling strip, and wherein the inner control loop is configured to have dynamic characteristics, which remain substantially the same for each scan of the controller, wherein the dynamic characteristics of the inner control loop are effective to determine a pointwise on-line control solution based on the matrix indicative of the state conditions of the strip rolling, without having to compute a Riccati control solution per scan, and wherein said dynamic characteristics of the inner control loop are established by keeping a matrix difference ($A_i(x)-BK_i$) substantially constant from scan to scan, wherein $A_i(x)$ represents the matrix estimated by the model indicative of the state conditions of the strip rolling for a present scan, B represents a constant control matrix, and $K_{i-1}$ represents a control gain matrix for the present scan.

8. The rolling mill of claim 7, wherein the control gain matrix for a present scan is defined by $K_1=B^{-L}(A_i(x)-A_{i-1}(x))+K_{i-1}$, where $B^{-L}$ represents a left inverse of the constant control matrix B, $A_{i-1}(x)$ represents the matrix estimated by the model indicative of the state conditions of the mill for a previous scan, $K_{i-1}$ represents the control gain matrix for the previous scan.

9. The rolling mill of claim 7, wherein the inner control loop comprises a multiple-input, multiple output control loop, and wherein the controller further comprises at least a first outer control loop and a second outer control loop coupled to the inner control loop, the first and second outer control loops each respectively comprising a plurality of single-input, single output control loops, the first and second outer control loops each including at least one respective tunable gain matrix, the first outer control loop configured to generate a first group of control trims, the second outer control loop configured to generate a second group of control trims, wherein the first group of control trims comprises a plurality of thickness trims and the second group of control trims comprises a plurality of tension trims.

10. The rolling mill of claim 9, wherein the controller further comprises a control loop coupled to the inner control loop configured to generate a plurality of looper position trims.

11. A method to control metal strip rolling in response to a sequence of controller scans, the method comprising: sensing a plurality of parameters regarding the metal strip rolling; in response to the sensed parameters, estimating per scan at least one matrix based on the sensed parameters indicative of state conditions of the strip rolling; effecting a control law in an inner loop of a controller to generate a control vector per scan; configuring the inner control loop to have dynamic characteristics, which remain substantially the same for each scan of the controller; in view of the dynamic characteristics of the inner control loop, determining a pointwise on-line control solution based on the matrix indicative of the state conditions of the strip rolling, without having to compute a Riccati control solution per scan; and controlling compression forces to controllably shape a thickness of a metal strip traveling between mutually opposing rollers based on the control vector, and wherein the configuring of the inner control loop comprises keeping a matrix difference $(A_i(x)-BK_i)$ substantially constant from scan to scan, wherein $A_i(x)$ represents the matrix estimated by the model indicative of the state conditions of the mill for a present scan i, B represents a constant control matrix, and $K_i$ represents a control gain matrix for the present scan i, and further comprising defining the control gain matrix for a present scan by $K_i=B^{-L}(A_i(x)-A_{i-1}(x))+K_{i-1}$ where $B^{-L}$ represents a left inverse of the constant control matrix B, $A_{i-1}(x)$ represents the matrix estimated by the model indicative of the state conditions of the mill for a previous scan, $K_{i-1}$ represents the control gain matrix for the previous scan.

12. The method of claim 11, further comprising control signals derived from the control vector controlling respective levels of inter-stand tension to the strip rolling.

13. The method of claim 12, wherein the inner control loop is a multiple-input, multiple output control loop, and coupling to the inner control loop at least a first outer control loop and a second outer control loop, the first and second outer control loops each respectively comprising a plurality of single-input, single output control loops, the first and second outer control loops each including at least one respective tunable gain matrix, the first outer control loop configured to generate a first group of control trims and the second outer control loop configured to generate a second group of control trims, wherein the first group of control trims comprises a plurality of thickness trims and the second group of control trims comprises a plurality of tension trims.

14. The method of claim 11, further comprising configuring the controller to compute during an off-line preparation a pointwise control solution to a state-dependent algebraic Riccati equation to determine an off-line control gain matrix and off-line trim settings, the off-line preparation being performed prior to the steps recited in claim 11.

15. The method of claim 14, further comprising adapting the control gain matrix and trim settings determined during the off-line preparation to function as an initial control gain matrix and initial trim settings for determining the pointwise on-line control solution, the adapting being performed without recomputing a Riccati-based control solution.

16. The method of claim 12, further comprising configuring the plurality of single-input, single output control loops to provide a one-to-one relationship between a respective tuning parameter of the tunable gain matrix and a variable being tuned by the control trims.

17. A non-transitory tangible computer-readable storage medium having computer-executable instructions for performing the steps recited in claim 11.

* * * * *